US012689343B2

(12) United States Patent
Unterkircher

(10) Patent No.: US 12,689,343 B2
(45) Date of Patent: Jul. 21, 2026

(54) TRANSIMPEDANCE AMPLIFIER WITH INTEGRATED RECONFIGURABLE FILTER

(71) Applicant: Infineon Technologies AG, Neubiberg (DE)

(72) Inventor: Peter Unterkircher, Engerwitzdorf (AT)

(73) Assignee: Infineon Technologies AG, Neubiberg (DE)

( * ) Notice: Subject to any disclaimer, the term of this patent is extended or adjusted under 35 U.S.C. 154(b) by 452 days.

(21) Appl. No.: 18/452,896

(22) Filed: Aug. 21, 2023

(65) Prior Publication Data

US 2025/0070734 A1 Feb. 27, 2025

(51) Int. Cl.
*H03F 3/08* (2006.01)
*H03F 3/45* (2006.01)

(52) U.S. Cl.
CPC ... *H03F 3/45475* (2013.01); *H03F 2200/165* (2013.01); *H03F 2200/171* (2013.01); *H03F 2203/45116* (2013.01)

(58) Field of Classification Search
CPC .................................... H03F 3/08; H03F 3/45
USPC .................................................. 330/308, 260
See application file for complete search history.

(56) References Cited

U.S. PATENT DOCUMENTS 5,117,199 A * 5/1992 Wang .................. H03F 3/45192
330/252
6,052,030 A * 4/2000 Garner .................. H03G 1/007
330/86

FOREIGN PATENT DOCUMENTS

CN 120220375 A * 6/2025 ............. H04B 10/80

* cited by examiner

*Primary Examiner* — Henry Choe
(74) *Attorney, Agent, or Firm* — Slater Matsil, LLP

(57) ABSTRACT

A transimpedance amplifier includes: a first operational amplifier; a second operational amplifier; a first resistor coupled between a first input terminal of the first operational amplifier and a first output terminal of the first operational amplifier; a second resistor coupled between the first output terminal of the first operational amplifier and a first input terminal of the second operational amplifier; and a first capacitor-resistor-capacitor (CRC) network coupled between the first input terminal of the second operational amplifier and a first output terminal of the second operational amplifier, where the first CRC network is a first reconfigurable filter that is configured to function as a first-order high-pass filter or a second-order high-pass filter based on a first control signal applied to the first CRC network.

20 Claims, 9 Drawing Sheets

TRANSIMPEDANCE AMPLIFIER WITH INTEGRATED RECONFIGURABLE FILTER

TECHNICAL FIELD

The present invention relates generally to transimpedance amplifiers with integrated reconfigurable filter used for receiving radio frequency (RF) signals.

BACKGROUND

Applications in the millimeter-wave frequency regime have gained significant interest in the past few years due to the rapid advancement in low cost semiconductor technologies such as silicon germanium (SiGe) and fine geometry complementary metal-oxide semiconductor (CMOS) processes. Availability of high-speed bipolar and metal-oxide semiconductor (MOS) transistors has led to a growing demand for integrated circuits for millimeter-wave applications at, e.g., 60 GHz, 77 GHz, and 80 GHz, or even beyond 100 GHz. Such applications include, for example, automotive radar systems and multi-gigabit communication systems.

Radar is used for different applications such as target identification/tracking, positioning, monitoring of physical conditions, or motion/gesture sensing. Radar systems using radio frequency integrated circuits (RFICs), such as monolithic microwave integrated circuits (MMICs), have been widely deployed in autonomous driving vehicles. In a frequency-modulated continuous-wave (FMCW) radar system, the transmitted RF signal includes a plurality of frames, where each frame includes a frequency ramp signal (also referred to as a chirp signal). The transmitted RF signal is reflected by a target, and the reflected RF signal is received for processing to retrieve information about the target. Transimpedance amplifiers are used in RF receiving systems. There is need in the art for improved transimpedance amplifiers that are flexible (e.g., reconfigurable), low-power, low-cost (e.g., small silicon area), and with good performance.

SUMMARY

In accordance with an embodiment, a transimpedance amplifier includes: a first operational amplifier; a second operational amplifier; a first resistor coupled between a first input terminal of the first operational amplifier and a first output terminal of the first operational amplifier; a second resistor coupled between the first output terminal of the first operational amplifier and a first input terminal of the second operational amplifier; and a first capacitor-resistor-capacitor (CRC) network coupled between the first input terminal of the second operational amplifier and a first output terminal of the second operational amplifier, wherein the first CRC network is a first reconfigurable filter that is configured to function as a first-order high-pass filter or a second-order high-pass filter based on a first control signal applied to the first CRC network.

In accordance with an embodiment, an integrated circuit includes: a mixer configured to down-convert a radio frequency (RF) signal; and a transimpedance amplifier coupled to the mixer, the transimpedance amplifier comprising: a first operational amplifier, wherein a first input terminal of the first operational amplifier is coupled to an output terminal of the mixer; a first resistor coupled between the first input terminal of the first operational amplifier and a first output terminal of the first operational amplifier; a second operational amplifier; a second resistor coupled between the first output terminal of the first operational amplifier and a first input terminal of the second operational amplifier; and a first reconfigurable filter coupled between the first input terminal of the second operational amplifier and a first output terminal of the second operational amplifier, wherein the first reconfigurable filter is configured to, under control of a first control signal, switch between a first-order high-pass filter and a second-order high-pass filter.

In accordance with an embodiment, a transimpedance amplifier includes: a first operational amplifier; a second operational amplifier; a first resistor coupled between a first input terminal of the first operational amplifier and a first output terminal of the first operational amplifier; a second resistor coupled between the first output terminal of the first operational amplifier and a first input terminal of the second operational amplifier; and a capacitor-resistor-capacitor (CRC) network coupled between the first input terminal of the second operation amplifier and a first output terminal of the second operational amplifier, comprising: a first capacitor coupled between an input terminal of the CRC network and a node; a second capacitor coupled between the node and an output terminal of the CRC network; and a third resistor coupled between the node and a reference voltage node.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EXAMPLES

Figure 1:
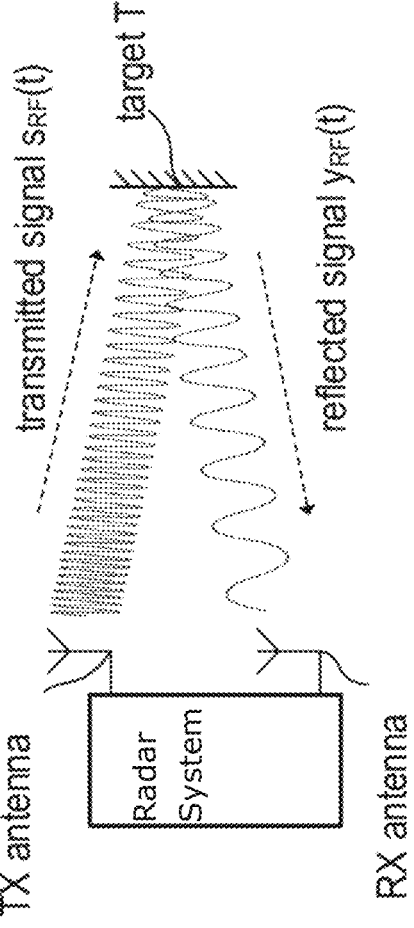
FIG. 1 illustrates a block diagram of a radar system, in an embodiment.

The making and using of the presently disclosed examples are discussed in detail below. It should be appreciated, however, that the present invention provides many applicable inventive concepts that can be embodied in a wide variety of specific contexts. The specific examples discussed are merely illustrative of specific ways to make and use the invention, and do not limit the scope of the invention. Throughout the discussion herein, unless otherwise specified, the same or similar reference numerals in different figures refer to the same or similar component. For simplicity, details of components with the same or similar reference numeral may not be re-described.

The present disclosure will be described with respect to examples in a specific context, namely an FMCW radar system having a transimpedance amplifier with integrated reconfigurable filter. Skilled artisans will readily appreciate that the transimpedance amplifiers disclosed herein may be used in other types of RF systems besides FMCW radar systems.

FIG. 1 illustrates the working principle of a frequency-modulated continuous-wave (FMCW) radar system, in an example. In the illustrated example of FIG. 1, the FMCW radar system transmits a radio frequency (RF) signal, which is a frequency-modulated continuous-wave signal, using one or more transmit (Tx) antennas. The transmitted RF signal bounces back from a target, and is received by the FMCW radar system using one or more receive (Rx) antennas. In FMCW radar systems, the frequency difference between the received RF signal and the transmitted RF signal increases proportionally with the time delay between the transmitted and received RF signals. Therefore, the distance between the FMCW radar system and the target can be determined by finding the frequency difference between the transmitted and received RF signals.

Figure 2:
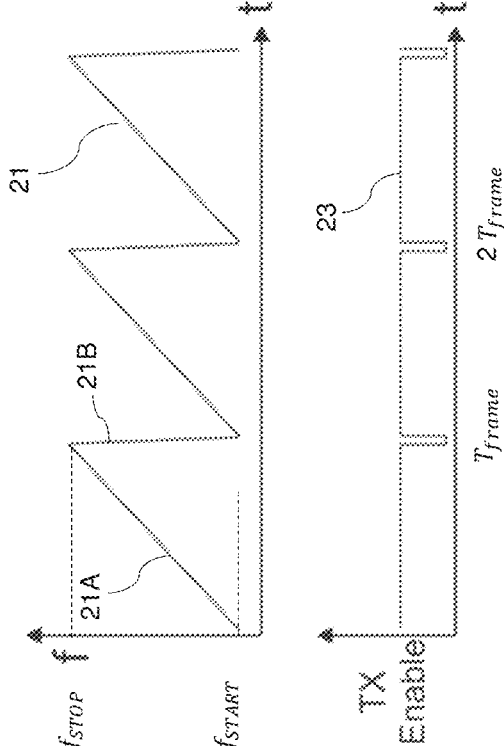
FIG. 2 illustrates an RF signal of a frequency-modulated continuous-wave (FMCW) radar system, in an embodiment.

FIG. 2 illustrates an RF signal 21 of an FMCW radar system, in an embodiment. In FIG. 2, two subplots are illustrated. The top subplot shows the frequency of the RF signal 21 (e.g., an FWCW signal) over a plurality of frames, where each frame has a duration of Tframe. Each frame of the RF signal includes a frequency ramp signal 21A, with the frequency of the RF signal 21 changes (e.g., increases) linearly from a first frequency (e.g., fSTART) to a second frequency (e.g., fsrop). The frequency ramp signal 21A within each frame is also referred to as a chirp signal. Within each frame, a fly-back signal 21B is generated after the frequency ramp signal 21A in a short period of time (referred to as a fly-back period), during which the frequency of the RF signal 21 drops quickly from fsrop back to fsTART. In FMCW radar systems, transmission of the RF signal 21 may be disabled during the fly-back periods. The lower subplot of FIG. 2 shows a Tx enable signal 23 for enabling (e.g., allowing) or disabling (e.g., stopping) transmission of the RF signal 21. In the example of FIG. 2, the Tx enable signal 23 is de-asserted (e.g., having a logic low value) during the fly-back periods, which instructs the RF transmitter of the FMCW radar system to stop transmission of the RF signal 21 during the fly-back periods. In the example of FIG. 2, the frequency ramp signal 21A is shown as having an increasing frequency, and the fly-back signal 21B is shown as having a decreasing frequency. In other embodiments, the frequency ramp signal 21A has a decreasing frequency, and the fly-back signal 21B has an increasing frequency. In some embodiments, the frequencies of the frequency ramp signal 21A and the fly-back signal 21B change (e.g., increase, or decrease) non-linearly.

Figure 3:
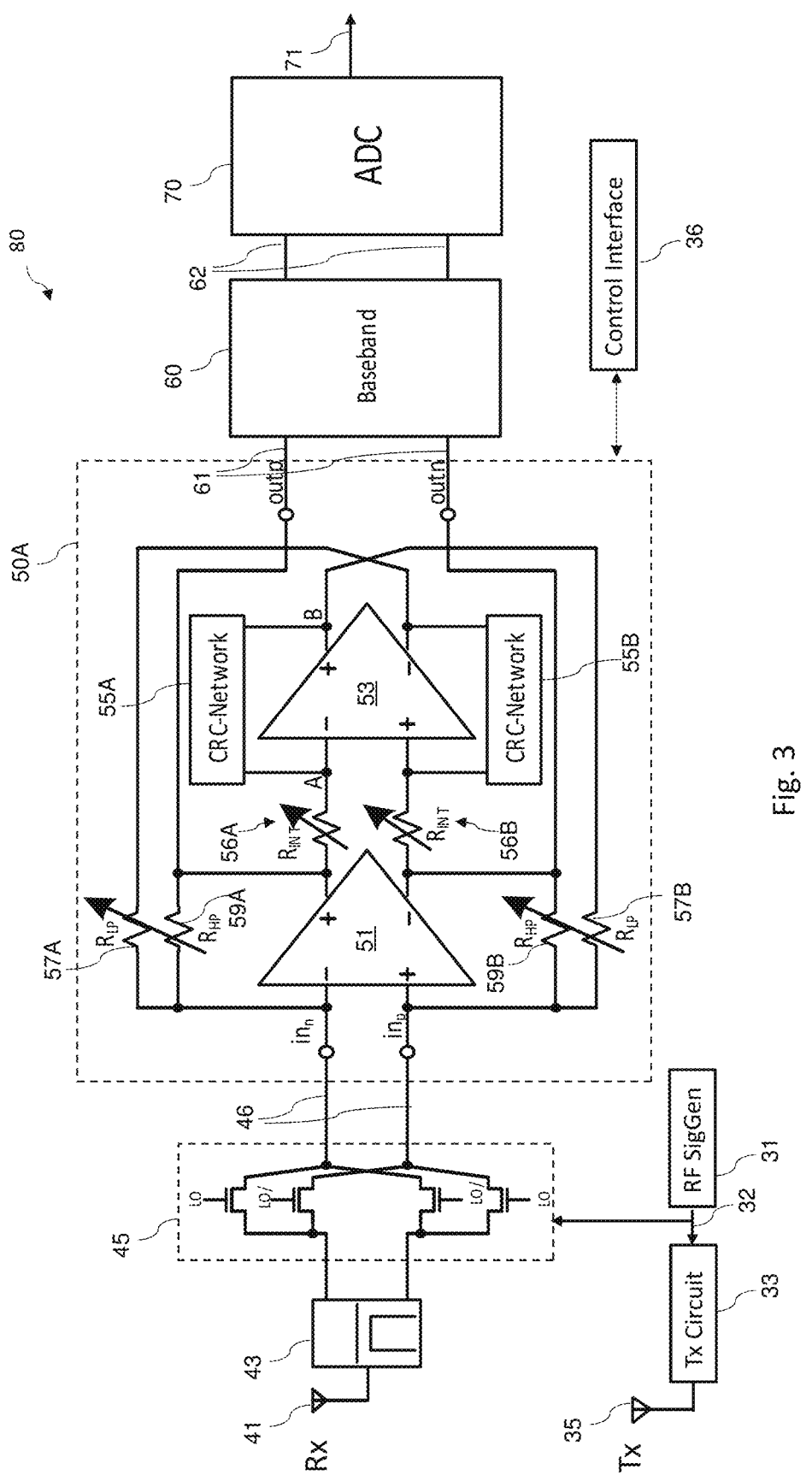
FIG. 3 illustrates a bock diagram of an FMCW radar system, in an embodiment.

FIG. 3 illustrates a block diagram of an FMCW radar system 80, in an embodiment. Note that for simplicity, not all features of the FMCW radar system 80 are illustrated. As shown in FIG. 3, the FMCW radar system 80 includes a transmit processing chain and a receive processing chain, details are discussed hereinafter.

The transmit processing chain of the FMCW radar system 80 includes an RF signal generator 31, a transmit circuit 33, and a transmit antenna 35. The RF signal generator generates an RF signal 32, such as the RF signal 21 in FIG. 2. The RF signal 32 is sent to the transmit circuit 33, which may include circuits such as amplifiers to process the RF signal 32 to get it ready for transmission. The output of the transmit circuit 33 is then sent to the transmit antenna 35 and transmitted. The number of transmit antenna 35 and the number of receive antenna 41 illustrated in FIG. 3 are illustrative only and not limiting, other numbers are also possible and are fully intended to be included within the scope of the present disclosure.

The receive processing chain of the FMCW radar system 80 includes the receive antenna 41, an RF front-end circuit 43, a mixer 45, a transimpedance amplifier 50A, a baseband circuit 60, and an analog-to-digital converter (ADC) 70. The RF front-end circuit 43 may be or include any suitable RF front-end processing circuit, such as low-noise amplifier, impedance matching circuit, combinations thereof, or the like. The output of the RF front-end circuit 43 is sent to the mixer 45, which mixes (e.g., multiplies) the received RF signal with a reference signal. In the example of FIG. 3, the RF signal 32 generated by the RF signal generator 31 is sent to the mixer 45 and used as the reference signal. The mixer 45 in the example of FIG. 3 is formed by a plurality of transistors, although any suitable mixer may be used as the mixer 45. The mixer 45 in FIG. 3 generates an output signal 46, which is a differential current signal. The output signal 46 of the mixer 45 is sent to the input terminals $in_n$ and $in_p$ of the transimpedance amplifier 50A.

The transimpedance amplifier 50A in FIG. 3 receives, amplifies, and filters the output signal 46, and generates an output signal 61 (e.g., a differential voltage signal) at output terminals $out_n$ and $out_p$ of the transimpedance amplifier 50A. As will be discussed in more detail, the transimpedance amplifier 50A has integrated capacitor-resistor-capacitor (CRC) networks 55 (e.g., 55A and 55B), which CRC networks 55 are reconfigurable filters that can function as first-order high-pass filters or second-order high-pass filters, depending on control signals for the CRC networks 55.

The differential voltage signal generated at the output terminals $out_n$ and $out_p$ of the transimpedance amplifier 50A are sent to the baseband circuit 60, which performs additional baseband processing, such as additional filtering (e.g., band-pass filtering, low-pass filtering), amplification of the signal, voltage shifting, combinations thereof, or the like. The output signal 62 (e.g., a differential signal) of the baseband circuit 60 is sent to the ADC 70, and is converted into a digital signal 71 (e.g., digital samples) for further processing. The digital signal 71 generated by the ADC 70 may be processed by digital signal processing to detect target(s) and extract useful information of the target(s), such as the distance and/or the speed of the target(s). The digital signal 71 may be processed by, e.g., a micro-controller, a digital signal processor, an application-specific integrated circuit (ASIC), or the like.

FIG. 3 further illustrates a control interface 36, which may include control registers for setting the various parameters of the FMCW radar system 80. For example, the control registers may be used for mode selection of the CRC networks 55 (e.g., switching the CRC networks 55 between first-order high-pass filters and second-order high-pass filters), for setting the frequency response (e.g., corner frequency) of the transimpedance amplifier 50A, or for setting the gain of the transimpedance amplifier 50A. The registers in the control interface 36 may be set (e.g., programmed) by a controller of the FMCW radar system 80.

In some embodiments, all of the components of the FMCW radar system 80 or portions of the components of the FMCW radar system 80 in FIG. 3 are integrated into an integrated circuit (IC) device, e.g., on a monolithic substrate such as silicon, silicon germanium, or the like. For example, except for the antennas (e.g., 35, 41), all other components of the FMCW radar system 80 shown in FIG. 3 are integrated into an IC device. As another example, the RF front-end circuit 43, the mixer 45, the transimpedance amplifier 50A, the control interface 36, the RF signal generator 31, and the transmit circuit 33 are integrated into an IC device. These and other variations are fully intended to be included within the scope of the present disclosure.

As discussed above, in the FMCW radar system 80, the output signal 46 of the mixer 45 is or includes a frequency signal (e.g., a sinusoidal signal, a tone signal) having a frequency that is proportional to the distance between the FMCW radar system 80 and the target. In certain applications, the received RF signal may include reflections from a close-by object that is not the intended target. For example, for an FMCW radar system installed on an automobile, portions of the transmitted RF signal are reflected by the bumper of the automobile. The reflections from the bumper may appear as a close target and generate a tone signal with a low frequency of, e.g., around 8 kHz at the output of the mixer 45. In contrast, the tone signal generated by a real target has a higher frequency, e.g., between 1 MHz and 2 MHz, or even higher.

The tone signal generated by the reflections from the bumper interferences with the subsequent signal processing to detect the real target, and therefore, should be removed. A high-pass filter, which filters out the low-frequency components (e.g., lower than about 8 kHz) and passes through high-frequency components (e.g., higher than about 1 MHz), may be used to remove the interference caused by the reflected signal from the bumper. The use of high-pass filter enables amplification in subsequent processing stages to decrease noise figure (NF) and to increase spurious-free dynamic range (SFDR). Since the transmitted RF signal and the received RF signal each experiences a loss of 20 dB/decade, a second-order high-pass filter would cancel out the effect of the signal loss and may provide a flat frequency response. However, some radar receiver designs may still prefer to use a first-order high-pass filter for various reasons. The current disclosure discloses various embodiments of a transimpedance amplifier with integrated reconfigurable high-pass filter(s), where the high-pass filter(s) can switch between first-order high-pass filter(s) and second-order high-pass filter(s), based on the control signal(s) applied to the reconfigurable high-pass filter(s), thus providing flexibility in the receive processing chain.

An embodiment of the transimpedance amplifier is shown in FIG. 3. In the example of FIG. 3, the transimpedance amplifier 50A includes operational amplifiers 51 and 53, which are differential operational amplifiers (also referred to as full differential operational amplifiers) that receive differential input signals and generates differential output signals. As illustrated in FIG. 3, a resistor 59A, which is an adjustable resistor, is coupled between the inverted input terminal of the operational amplifier 51 and the non-inverted output terminal of the operational amplifier 51. A resistor 56A, which is an adjustable resistor, is coupled between the non-inverted output terminal of the operational amplifier 51 and the inverted input terminal of the operational amplifier 53. A CRC network 55A is coupled between the inverted input terminal of the operational amplifier 53 and the non-inverted output terminal of the operational amplifier 53.

Similarly, a resistor 59B, which is an adjustable resistor, is coupled between the non-inverted input terminal of the operational amplifier 51 and the inverted output terminal of the operational amplifier 51. A resistor 56B, which is an adjustable resistor, is coupled between the inverted output terminal of the operational amplifier 51 and the non-inverted input terminal of the operational amplifier 53. A CRC network 55B is coupled between the non-inverted input terminal of the operational amplifier 53 and the inverted output terminal of the operational amplifier 53. The CRC networks 55A and 55B may be collectively referred to as the CRC networks 55.

In addition, a resistor 57A (e.g., an adjustable resistor) is coupled between the inverted input terminal of the operational amplifier 51 and the inverted output terminal of the operational amplifier 53, and a resistor 57B is coupled between the non-inverted input terminal of the operational amplifier 51 and the non-inverted output terminal of the operational amplifier 53. In some embodiments, components with the same reference numeral but different alphabet (e.g., 56A and 56B) have the same nominal value (e.g., same nominal resistance value), although different nominal values may also be possible and are fully intended to be included within the scope of the present disclosure.

In some embodiments, the CRC networks 55A and 55B have the same structure. For example, each of the CRC networks 55A and 55B may be an instance of the CRC network 100 shown in FIG. 4. In addition, corresponding components between the CRC networks 55A and 55B, such as resistors, capacitors, and switches, may have the same nominal value and/or of the same type (e.g., MOSFET as the switches). In other words, the CRC network 55B is a replica of the CRC network 55A, in some embodiments. The input terminals of the operational amplifier 51 are coupled to the input terminals $in_n$ and $in_p$ of the transimpedance amplifier 50A, and the output terminals of the operational amplifier 51 are coupled to the output terminals $out_n$ and $out_p$ of the transimpedance amplifier 50A.

Figure 4:
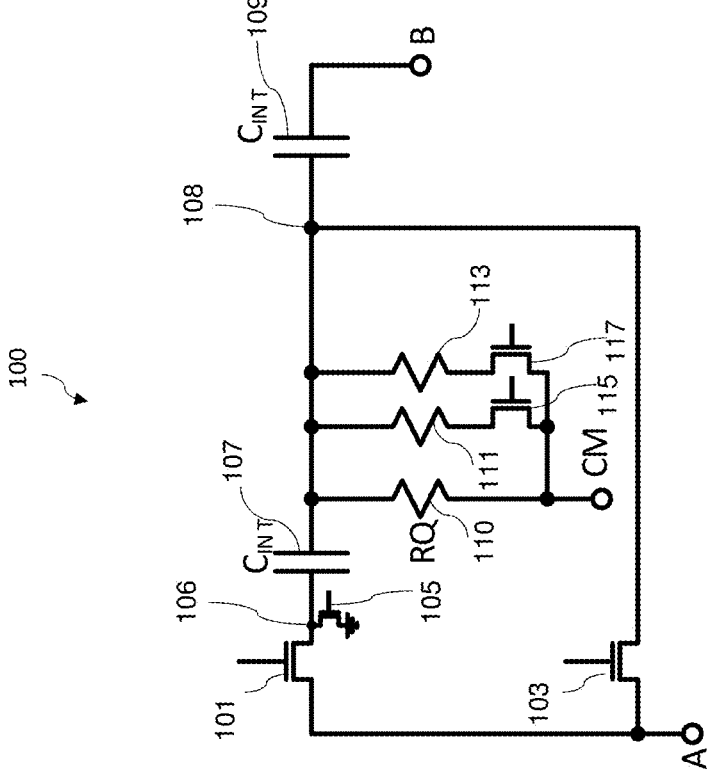
FIG. 4 illustrates a schematic diagram of a capacitor-resistor-capacitor (CRC) network, in an embodiment.

FIG. 4 illustrates a schematic diagram of a capacitor-resistor-capacitor (CRC) network 100, in an embodiment. The CRC network 100 is a reconfigurable filter that switches between a first-order high-pass filter and a second-order high-pass filter. The CRC network 100 may be used as the CRC network 55A and 55B in FIG. 3 or 5, or as the CRC network 55 in FIG. 6 or 7.

As illustrated in FIG. 4, the CRC network 100 includes a switch 101 and a capacitor 107 that are coupled in series between an input terminal A of the CRC network 100 and a node 108. A capacitor 109 is coupled between the node 108 and an output terminal B of the CRC network 100. The capacitors 107 and 109 may or may not have a same capacitance value. When used in the transimpedance amplifier (e.g., 50A, 50B, 50C, or 50D), the input terminal A of the CRC network 100 is coupled to a respective input terminal of a respective operation amplifier, and the output terminal B of the CRC network 100 is coupled to a respective output terminal of the respective operation amplifier, as illustrated in, e.g., FIG. 3. For ease of discussion, the transimpedance amplifiers 50A, 50B, 50C, and 50D may be collectively referred to as transimpedance amplifiers 50.

Still referring to FIG. 4, a switch 103 is coupled between the input terminal A of the CRC network 100 and the node 108. A resistor 110 is coupled between the node 108 and a reference node CM, where the reference node CM is configured to be connected to a common mode voltage (also referred to as virtual ground) of the transimpedance amplifier 50A during normal operation of the transimpedance amplifier 50A. In addition, a resistor 111 and a switch 115 are coupled in series between the node 108 and the reference node CM, and a resistor 113 and a switch 117 are coupled in series between the node 108 and the reference node CM. Skilled artisans will readily appreciate that by turning ON or OFF the switches 115 and/or 117, the equivalent resistance RQ of the resistors coupled in parallel (e.g., 110, 111, and 113) can be selected between a plurality of pre-determined values. As will be discussed hereinafter, the equivalent resistance RQ may be used to tune the frequency response of the transimpedance amplifier 50.

The switches (e.g., 101, 103, 115, 117, 105) in the CRC network 100 may be any suitable switches, such as metal-oxide-semiconductor field-effect transistors (MOSFETs), insulated gate bipolar transistors (IGBTs), bipolar junction transistors (BJTs), or the like. A control signal applied at the control terminal (e.g., gate terminal) of the switch may turn the switch ON or OFF. When the switch 101 is turned ON and the switch 103 is turned OFF, the CRC network 100 functions as a second-order high-pass filter. Conversely, when the switch 101 is turned OFF and the switch 103 is turned ON, the CRC network 100 functions as a first-order high-pass filter.

FIG. 4 further illustrates a switch 105 coupled between a node 106 and the electrical ground, where the node 106 is between the switch 101 and the capacitor 107. The switch 105 is turned OFF when the switch 101 is turned ON, and is turned ON when the switch 101 is turned OFF. This ensures that when the switch 101 is turned OFF, the node 106 is at a known, pre-predetermined voltage level (e.g., electrical ground).

Referring back to FIG. 3. The frequency response of the transimpedance amplifier 50A is adjusted by adjusting the order of the high-pass filters in the CRC networks 55, and by adjusting the values of the various components in the transimpedance amplifier 50A. For example, when the CRC networks 55 function as second-order high-pass filters, then the frequency response of the transimpedance amplifier 50A is a second-order high-pass filter; and when the CRC networks 55 function as first-order high-pass filters, then the frequency response of the transimpedance amplifier 50A is a first-order high-pass filter. Note that during normal operation of the transimpedance amplifier 50A, the control signals (which turns ON or OFF the switches 101 and 103) for the CRC networks 55A and 55B have the same value (e.g., at the same voltage level), such that the modes of the CRC networks 55A and 55B are synchronous (e.g., the CRC networks 55A and 55B function as first-order high-pass filters or second-order high-pass filters at the same time). The control signals for the CRC networks 55A and 55B may be the same control signal, or may be different control signals (but having the same values).

Figure 8:
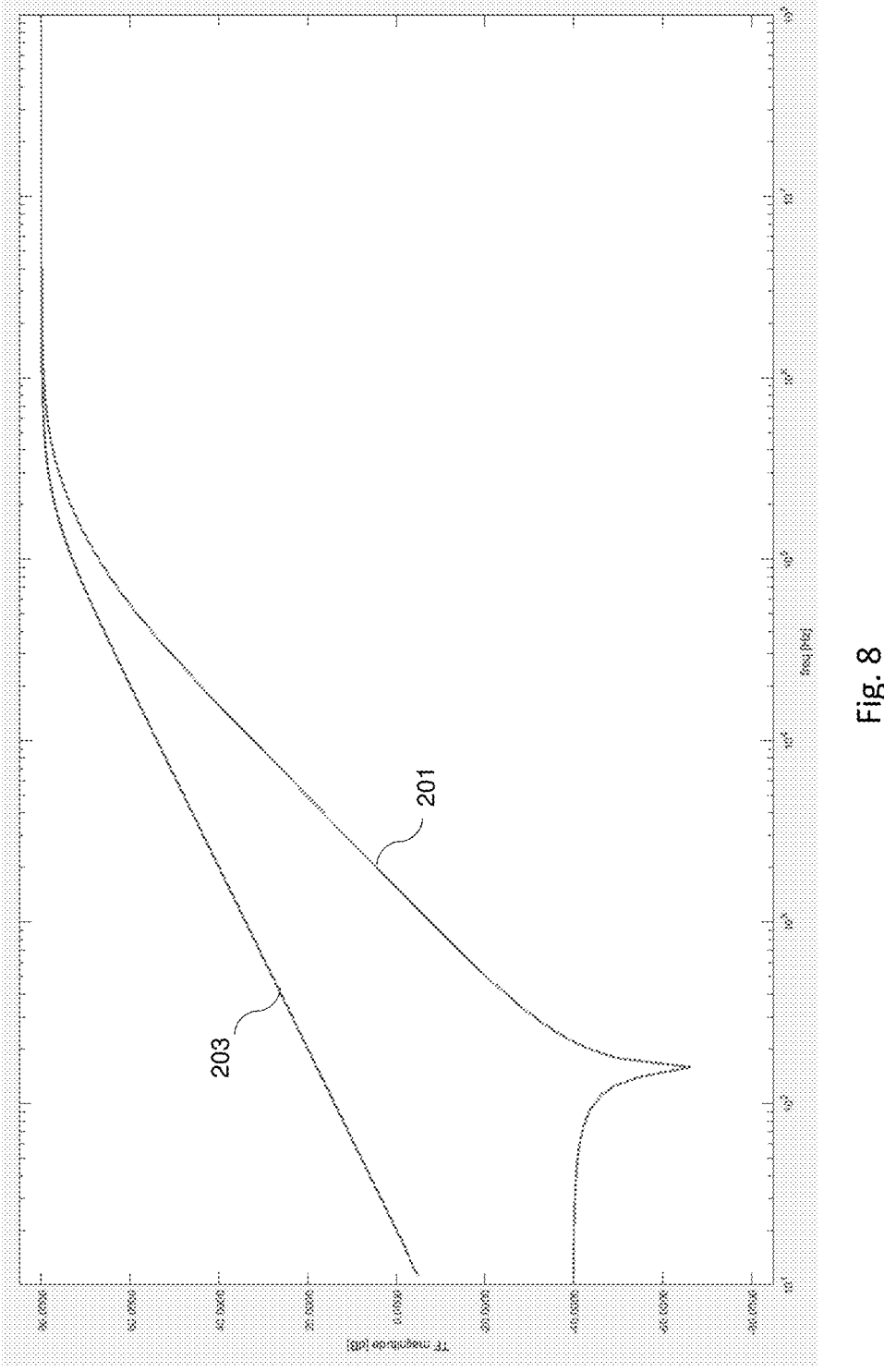
FIG. 8 illustrates the frequency response of the transimpedance amplifier, in an embodiment.

FIG. 8 shows the frequency responses of the transimpedance amplifier 50A, in an embodiment. In particular, the curve 203 and 201 show the frequency response of the transimpedance amplifier 50A as a first-order high-pass filter and a second-order high-pass filter, respectively.

In some embodiments, the corner frequency $f_c$ of the first-order high-pass filter of the transimpedance amplifier 50A is given by $$f_c = \frac{R_{HP}/R_{LP}}{2\pi R_{INT} \times C_{INT}} \quad (1)$$

where $R_{HP}$ is the resistance of the resistors 59A and 59B, $R_{LP}$ is the resistance of the resistors 57A and 57B, $R_{INT}$ is the resistance of the resistors 56A and 56B, and $C_{INT}$ is the capacitance of the capacitors 107 and 109. Note that for a high-pass filter, the corner frequency $f_c$ corresponds to the starting frequency of the pass band. As non-limiting examples, the $R_{HP}$ may be around 10 kΩ, the $R_{LP}$ may be around 1 kΩ, the $C_{INT}$ may be around 25 pF, the $R_{INT}$ may be between about 20 kΩ and about 400 kΩ, the RQ may be about 50 kΩ.

Figure 9:
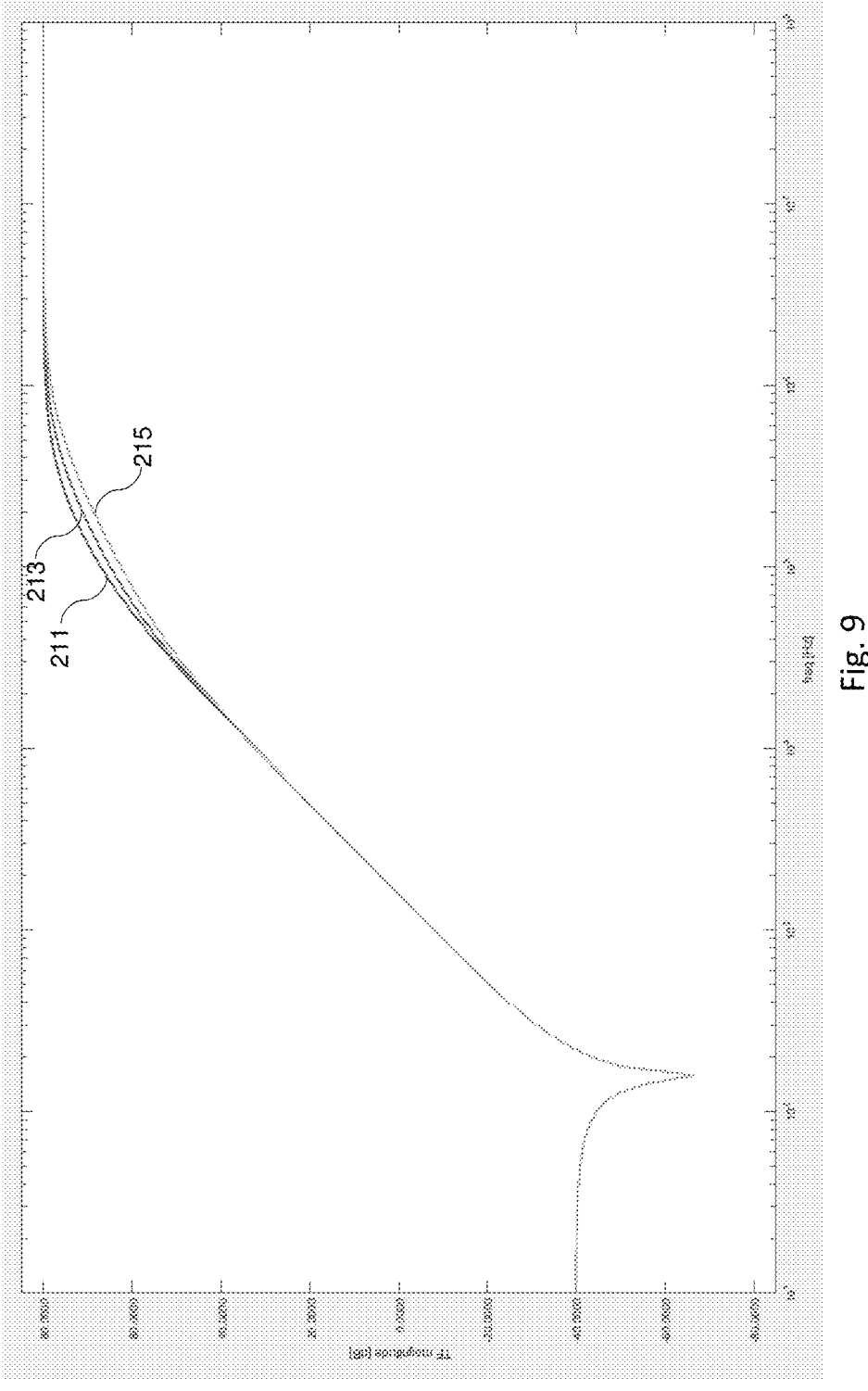
FIG. 9 illustrates the frequency response of the transimpedance amplifier, in another embodiment.

The values of the resistors and capacitors of the transimpedance amplifier 50A may be adjusted to change the frequency response of the transimpedance amplifier 50A. For example, increasing the resistance $R_{INT}$ increases the corner frequency. As another example, increasing the resistances $R_{HP}$ or $R_{LP}$ increases the gain of the transimpedance amplifier 50A. As yet another example, by changing the equivalent resistance RQ of the resistors in the CRC network 100, the pole ratio (which is the ratio between the pole locations (in Hz) of the second-order high-pass filter) of the second-order high-pass filter can be changed, which in turn changes the behavior (e.g., the peaking behavior) of the frequency response in the region around the corner frequency (e.g., between the pass band and the stop band of the second-order high-pass filter). FIG. 9 shows the impact of changing the pole ratio, in an embodiment.

In FIG. 9, three frequency response curves corresponding to three different pole ratios are illustrated. The pole ratios of the curves 211, 213, and 215 are 5.1, 10.4, and 20.4, respectively. In the example of FIG. 10, as the pole ratio increases, the frequency response around the corner frequency gets more flattened out. Although not shown, the frequency response curve may exhibit peaking behavior around the corner frequency, depending on the value of the pole ratio.

Figure 5:
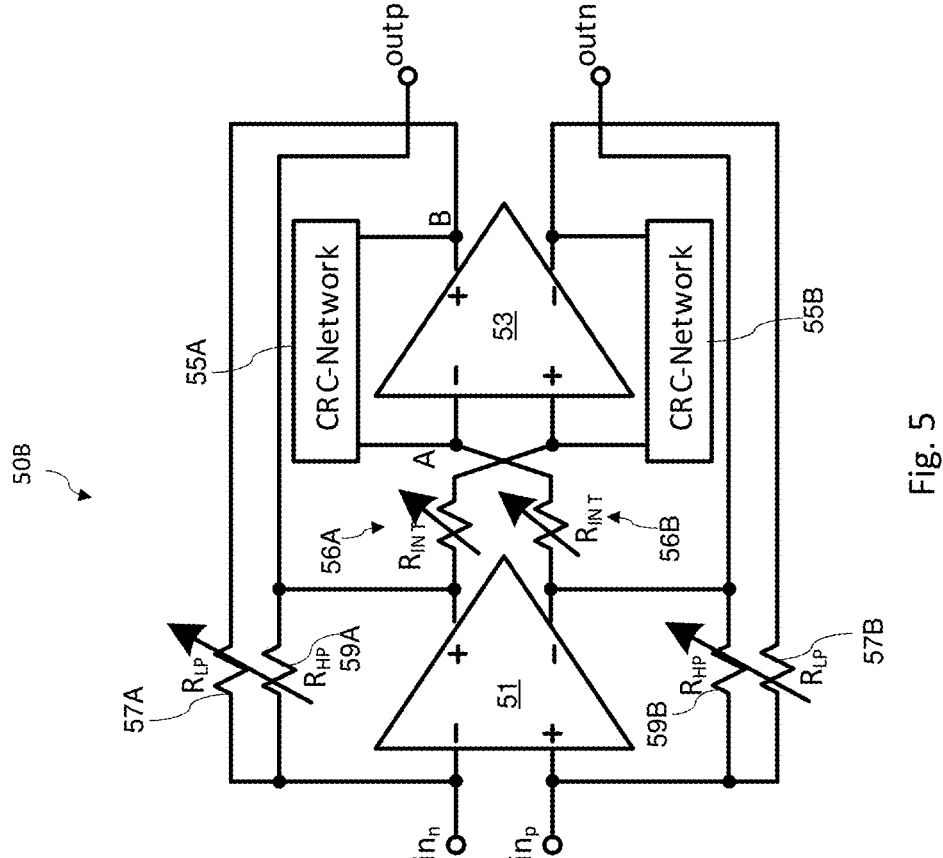
FIG. 5 illustrates a block diagram of a transimpedance amplifier, in an embodiment.

FIG. 5 illustrates a block diagram of a transimpedance amplifier 50B, in an embodiment. The transimpedance amplifier 50B may be used to replace the transimpedance amplifier 50A in FIG. 3. The transimpedance amplifier 50B is similar to the transimpedance amplifier 50A, but the resistor 56A is coupled between the non-inverting output terminal of the operational amplifier 51 and the non-inverting input terminal of the operational amplifier 53, and the resistor 56B is coupled between the inverting output terminal of the operational amplifier 51 and the inverting input terminal of the operational amplifier 53. In addition, the resistor 57A is coupled between the inverting input terminal of the operational amplifier 51 and the non-inverting output terminal of the operational amplifier 53, and the resistor 57B is coupled between the non-inverting input terminal of the operational amplifier 51 and the inverting output terminal of the operational amplifier 53.

Variations to the disclosed embodiments are possible and are fully intended to be included within the scope of the present disclosure. In the example in FIG. 3, differential signals are used in the receive processing chain. For example, the output signal 46 from the mixer 45 is a differential signal (e.g., a differential current signal), and the transimpedance amplifier 50A are formed using fully differential operational amplifiers and generates a differential output voltage signal 61. The baseband circuit 60 and the ADC 70 are also configured to receive and process differential signals. The FMCW radar system 80 in FIG. 3 can be easily adapted for systems that uses single-ended signals, as skilled artisans readily appreciate. In embodiments where single-ended signals are used in the receive processing chain, the mixer 45 generates a single-ended output signal 46, and a transimpedance amplifier (described hereinafter in detail), which processes the singled-ended input signal and generates a single-ended output signal 61, is used. The single-ended output signal 61 is then sent to the baseband circuit 60 and the ADC 70, which are also adapted to receive and process single-ended signals. Various embodiments of the transimpedance amplifier that processed the singled-ended input signal 46 and generates a single-ended output voltage signal 61 are discussed below with reference to FIGS. 6 and 7.

Figure 6:
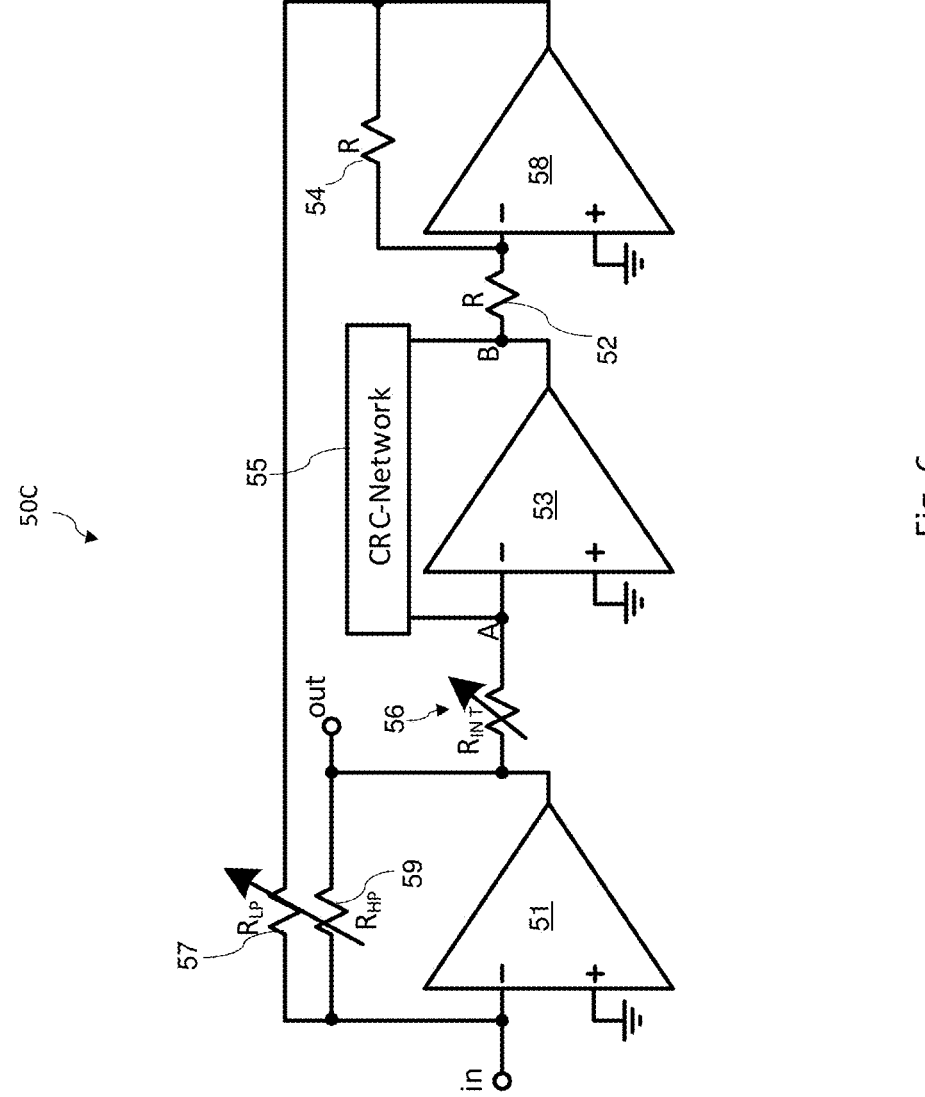
FIG. 6 illustrates a block diagram of a transimpedance amplifier, in another embodiment.

FIG. 6 illustrates a block diagram of a transimpedance amplifier 50C, in another embodiment. The transimpedance amplifier 50C receives a single-ended input signal (e.g., a single-ended current signal) at an input terminal in, and outputs a single-ended output signal (e.g., a single-ended voltage signal) at an output terminal out.

In FIG. 6, the transimpedance amplifier 50C includes operational amplifiers 51, 53, and 58. A resistor 59 (e.g., an adjustable resistor) is coupled between the inverting input terminal of the operational amplifier 51 and the output terminal of the operational amplifier 51. A resistor 56 (e.g., an adjustable resistor) is coupled between the output terminal of the operational amplifier 51 and the inverting input terminal of the operational amplifier 53. A CRC network 55 is coupled between the inverting input terminal of the operational amplifier 53 and the output terminal of the operational amplifier 53. The CRC network 55 may be implemented as the CRC network 100 in FIG. 4. A resistor 52 is coupled between the output terminal of the operational amplifier 53 and the inverting input terminal of the operational amplifier 58, and a resistor 54 is coupled between the inverting input terminal of the operational amplifier 58 and the output terminal of the operational amplifier 58. The resistors 52 and 54 have a same nominal resistance value R, in some embodiments. In addition, a resistor 57 is coupled between the inverting terminal of the operational amplifier 51 and the output terminal of the operational amplifier 58. The non-inverting input terminals of the operational amplifiers 51, 53, and 58 are coupled to the electrical ground, in the illustrated embodiment.

Skilled artisan will readily appreciate that the transimpedance amplifier 50C is similar to the transimpedance amplifier 50A, but with half of the resistors and one of the CRC networks removed due to the singled-ended input signal. In addition, the operational amplifier 58 is introduced to form an inverting stage to achieve stability of the transimpedance amplifier 50C. Note that in the transimpedance amplifiers 50A and 50B, the stability of the transimpedance amplifier is achieved by wire-crossing between the upper and lower signal paths of the transimpedance amplifier, and therefore, the operational amplifier 58 is not needed.

Figure 7:
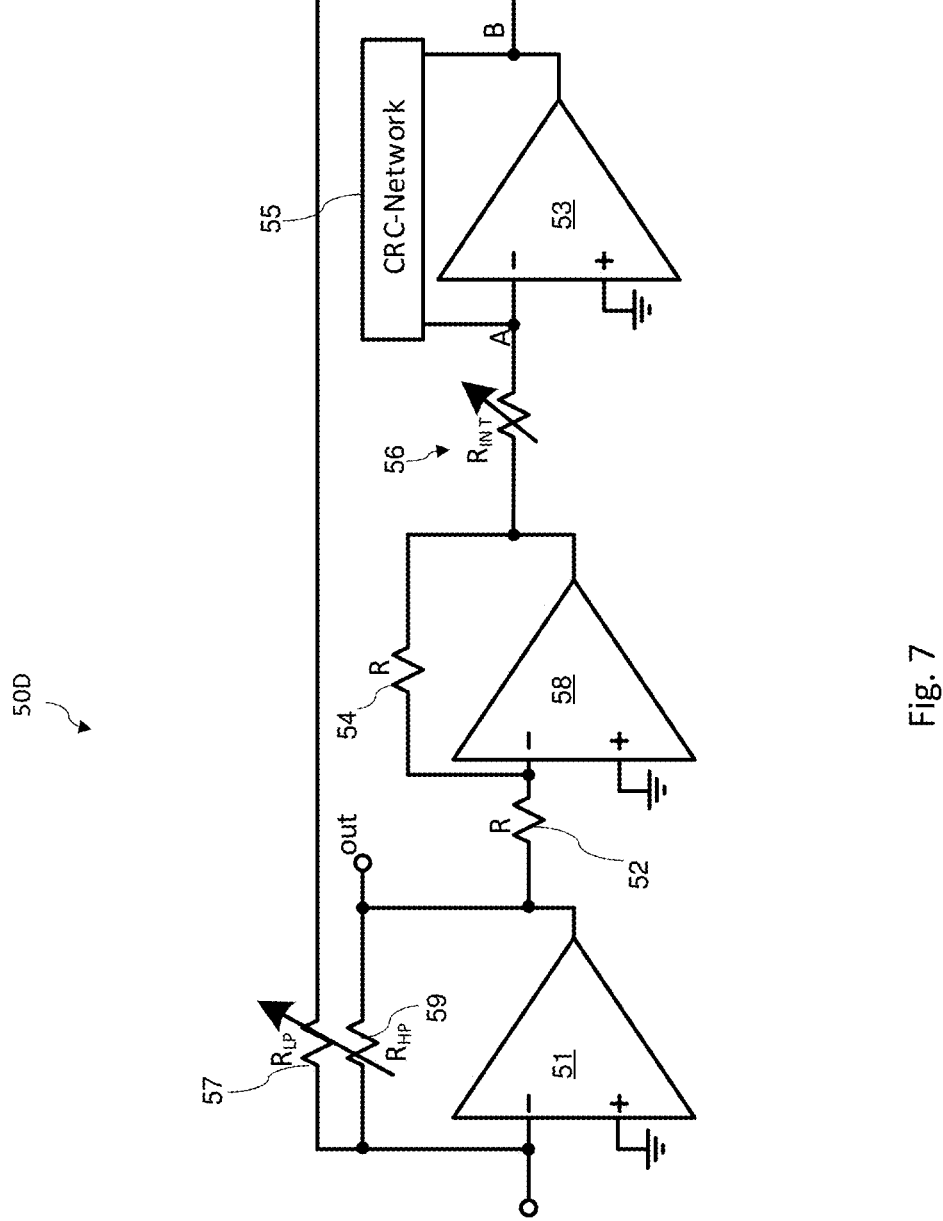
FIG. 7 illustrates a block diagram of a transimpedance amplifier, in yet another embodiment.

FIG. 7 illustrates a block diagram of a transimpedance amplifier 50D, in yet another embodiment. The transimpedance amplifier 50D is similar to the transimpedance amplifier 50C, but with the inverting stage (which includes the operational amplifier 58 and resistors 52 and 54) moved between the operational amplifiers 51 and 53.

Embodiments may achieve advantages as described below. The transfer function (e.g., frequency response) of the disclosed transimpedance amplifiers can be easily changed by switching the built-in CRC network between a first-order high-pass filter and a second-order high-pass filter. Various aspects of the high-pass filter, such as corner frequency, peaking behavior, as well as the gain of the transimpedance amplifier, can be easily adjusted by adjusting the values of the various adjustable resistors. The disclosed embodiments are able to form a second-order high-pass filter (e.g., the CRC network) in a single-ended stage. Compared with a reference design, where the second-order high-pass filter is formed in two stages, with a first stage comprising two operational amplifiers and a first-order high-pass filter followed by a second stage comprising a passive high-pass filter formed using additional amplifiers, capacitors, and resistors, the presently disclosed embodiments achieve reduced noise figure, increased spurious-free dynamic range (SFDR), reduced area (thus lower cost) and reduced power consumption.

Examples of the present invention are summarized here. Other examples can also be understood from the entirety of the specification and the claims filed herein.

Example 1. In an embodiment, a transimpedance amplifier includes: a first operational amplifier; a second operational amplifier; a first resistor coupled between a first input terminal of the first operational amplifier and a first output terminal of the first operational amplifier; a second resistor coupled between the first output terminal of the first operational amplifier and a first input terminal of the second operational amplifier; and a first capacitor-resistor-capacitor (CRC) network coupled between the first input terminal of the second operational amplifier and a first output terminal of the second operational amplifier, wherein the first CRC network is a first reconfigurable filter that is configured to function as a first-order high-pass filter or a second-order high-pass filter based on a first control signal applied to the first CRC network.

Example 2. The transimpedance amplifier of Example 1, wherein the first CRC network comprises: a first switch and a first capacitor that are coupled in series between an input terminal of the first CRC network and a node; a second switch coupled between the input terminal of the first CRC network and the node; a second capacitor coupled between the node and an output terminal of the first CRC network; and a third resistor coupled between the node and a reference voltage node.

Example 3. The transimpedance amplifier of Example 2, further comprising a fourth resistor and a third switch that are coupled in series between the node and the reference voltage node.

Example 4. The transimpedance amplifier of Example 3, wherein the first CRC network further comprises a fourth switch coupled between another node and an electrical ground, wherein the another node is between the first switch and the first capacitor.

Example 5. The transimpedance amplifier of Example 2, wherein the first switch is configured to be turned OFF and the second switch is configured to be turned ON when the first CRC network is configured to function as the first-order high-pass filter.

Example 6. The transimpedance amplifier of Example 5, wherein the first switch is configured to be turned ON and the second switch is configured to be turned OFF when the first CRC network is configured to function as the second-order high-pass filter.

Example 7. The transimpedance amplifier of Example 2, wherein the first operational amplifier and the second operational amplifier are differential operational amplifiers, wherein the transimpedance amplifier further comprises: a fourth resistor coupled between a second input terminal of the first operational amplifier and a second output terminal of the first operational amplifier; a fifth resistor coupled between the second output terminal of the first operational amplifier to a second input terminal of the second operational amplifier; and a second CRC network coupled between the second input terminal of the second operational amplifier and a second output terminal of the second operational amplifier, wherein the second CRC network is a second reconfigurable filter that is configured to function as a first-order high-pass filter or a second-order high-pass filter based on a second control signal applied to the second CRC network.

Example 8. The transimpedance amplifier of Example 7, wherein the first CRC network and the second CRC network have a same structure, wherein the first control signal and the second control signal are at a same voltage level during normal operation of the transimpedance amplifier.

Example 9. The transimpedance amplifier of Example 8, further comprising: a sixth resistor coupled between the first input terminal of the first operational amplifier and the second output terminal of the second operational amplifier; and a seventh resistor coupled between the second input terminal of the first operational amplifier and the first output terminal of the second operational amplifier.

Example 10. The transimpedance amplifier of Example 2, further comprising: a third operational amplifier; a fourth resistor coupled between the first output terminal of the second operational amplifier and a first input terminal of the third operational amplifier; a fifth resistor coupled between the first input terminal of the third operational amplifier and a first output terminal of the third operational amplifier; and a sixth resistor coupled between the first input terminal of the first operational amplifier and the first output terminal of the third operational amplifier.

Example 11. The transimpedance amplifier of Example 10, wherein a second input terminal of the first operational amplifier, a second input terminal of the second operational amplifier, and a second input terminal of the third operational amplifier are coupled to another reference voltage node.

Example 12. In an embodiment, an integrated circuit includes: a mixer configured to down-convert a radio frequency (RF) signal; and a transimpedance amplifier coupled to the mixer, the transimpedance amplifier comprising: a first operational amplifier, wherein a first input terminal of the first operational amplifier is coupled to an output terminal of the mixer; a first resistor coupled between the first input terminal of the first operational amplifier and a first output terminal of the first operational amplifier; a second operational amplifier; a second resistor coupled between the first output terminal of the first operational amplifier and a first input terminal of the second operational amplifier; and a first reconfigurable filter coupled between the first input terminal of the second operational amplifier and a first output terminal of the second operational amplifier, wherein the first reconfigurable filter is configured to, under control of a first control signal, switch between a first-order high-pass filter and a second-order high-pass filter.

Example 13. The integrated circuit of Example 12, wherein the first reconfigurable filter comprises: a first switch and a first capacitor that are coupled in series between an input terminal of the first reconfigurable filter and a node; a second switch coupled between the input terminal of the first reconfigurable filter and the node; a second capacitor coupled between the node and an output terminal of the first reconfigurable filter; and a third resistor coupled between the node and a reference voltage node.

Example 14. The integrated circuit of Example 13, wherein the first operational amplifier and the second operational amplifier are differential operational amplifiers, wherein the transimpedance amplifier further comprises: a fourth resistor coupled between a second input terminal of the first operational amplifier and a second output terminal of the first operational amplifier; a fifth resistor coupled between the second output terminal of the first operational amplifier to a second input terminal of the second operational amplifier; and a second reconfigurable filter coupled between the second input terminal of the second operational amplifier and a second output terminal of the second operational amplifier, wherein the second reconfigurable filter has a same structure as the first reconfigurable filter, and is configured to, under control of a second control signal, switch between a first-order high-pass filter or a second-order high-pass filter.

Example 15. The integrated circuit of Example 14, wherein the transimpedance amplifier further comprises: a sixth resistor coupled between the first input terminal of the first operational amplifier and the second output terminal of the second operational amplifier; and a seventh resistor coupled between the second input terminal of the first operational amplifier and the first output terminal of the second operational amplifier.

Example 16. The integrated circuit of Example 13, wherein the transimpedance amplifier further comprises: a third operational amplifier; a fourth resistor coupled between the first output terminal of the second operational amplifier and a first input terminal of the third operational amplifier; a sixth resistor coupled between the first input terminal of the third operational amplifier and a first output terminal of the third operational amplifier; and a seven resistor coupled between the first input terminal of the first operational amplifier and the first output terminal of the third operational amplifier.

Example 17. The integrated circuit of Example 12, further comprising an analog-to-digital converter coupled to an output terminal of the transimpedance amplifier.

Example 18. In an embodiment, a transimpedance amplifier includes: a first operational amplifier; a second operational amplifier; a first resistor coupled between a first input terminal of the first operational amplifier and a first output terminal of the first operational amplifier; a second resistor coupled between the first output terminal of the first operational amplifier and a first input terminal of the second operational amplifier; and a capacitor-resistor-capacitor (CRC) network coupled between the first input terminal of the second operation amplifier and a first output terminal of the second operational amplifier, comprising: a first capacitor coupled between an input terminal of the CRC network and a node; a second capacitor coupled between the node and an output terminal of the CRC network; and a third resistor coupled between the node and a reference voltage node.

Example 19. The transimpedance amplifier of Example 18, wherein the CRC network further comprises: a first switch coupled in series with the first capacitor between the input terminal of the CRC network and the node; and a second switch coupled between the input terminal of the CRC network and the node.

Example 20. The transimpedance amplifier of Example 18, further comprising: a third operational amplifier; a fourth resistor coupled between the first output terminal of the second operational amplifier and a first input terminal of the third operational amplifier; a fifth resistor coupled between the first input terminal of the third operational amplifier and a first output terminal of the third operational amplifier; and a sixth resistor coupled between the first input terminal of the first operational amplifier and the first output terminal of the third operational amplifier.

While this invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

What is claimed is:

1. A transimpedance amplifier comprising:
a first operational amplifier;
a second operational amplifier;
a first resistor coupled between a first input terminal of the first operational amplifier and a first output terminal of the first operational amplifier;
a second resistor coupled between the first output terminal of the first operational amplifier and a first input terminal of the second operational amplifier; and
a first capacitor-resistor-capacitor (CRC) network coupled between the first input terminal of the second operational amplifier and a first output terminal of the second operational amplifier, wherein the first CRC network is a first reconfigurable filter that is configured to switch between a first-order high-pass filter and a second-order high-pass filter based on a first control signal applied to the first CRC network.

2. The transimpedance amplifier of claim 1, wherein the first CRC network comprises:
a first switch and a first capacitor that are coupled in series between an input terminal of the first CRC network and a node;
a second switch coupled between the input terminal of the first CRC network and the node;
a second capacitor coupled between the node and an output terminal of the first CRC network; and
a third resistor coupled between the node and a reference voltage node.

3. The transimpedance amplifier of claim 2, further comprising a fourth resistor and a third switch that are coupled in series between the node and the reference voltage node.

4. The transimpedance amplifier of claim 3, wherein the first CRC network further comprises a fourth switch coupled between another node and an electrical ground, wherein the another node is between the first switch and the first capacitor.

5. The transimpedance amplifier of claim 2, wherein the first switch is configured to be turned OFF and the second switch is configured to be turned ON when the first CRC network is configured to function as the first-order high-pass filter.

6. The transimpedance amplifier of claim 5, wherein the first switch is configured to be turned ON and the second switch is configured to be turned OFF when the first CRC network is configured to function as the second-order high-pass filter.

7. The transimpedance amplifier of claim 2, wherein the first operational amplifier and the second operational amplifier are differential operational amplifiers, wherein the transimpedance amplifier further comprises:
a fourth resistor coupled between a second input terminal of the first operational amplifier and a second output terminal of the first operational amplifier;
a fifth resistor coupled between the second output terminal of the first operational amplifier and a second input terminal of the second operational amplifier; and
a second CRC network coupled between the second input terminal of the second operational amplifier and a second output terminal of the second operational amplifier, wherein the second CRC network is a second reconfigurable filter that is configured to function as a first-order high-pass filter or a second-order high-pass filter based on a second control signal applied to the second CRC network.

8. The transimpedance amplifier of claim 7, wherein the first CRC network and the second CRC network have a same structure, wherein the first control signal and the second control signal are at a same voltage level during normal operation of the transimpedance amplifier.

9. The transimpedance amplifier of claim 8, further comprising:
a sixth resistor coupled between the first input terminal of the first operational amplifier and the second output terminal of the second operational amplifier; and
a seventh resistor coupled between the second input terminal of the first operational amplifier and the first output terminal of the second operational amplifier.

10. The transimpedance amplifier of claim 2, further comprising:
a third operational amplifier;
a fourth resistor coupled between the first output terminal of the second operational amplifier and a first input terminal of the third operational amplifier;
a fifth resistor coupled between the first input terminal of the third operational amplifier and a first output terminal of the third operational amplifier; and
a sixth resistor coupled between the first input terminal of the first operational amplifier and the first output terminal of the third operational amplifier.

11. The transimpedance amplifier of claim 10, wherein a second input terminal of the first operational amplifier, a second input terminal of the second operational amplifier, and a second input terminal of the third operational amplifier are coupled to another reference voltage node.

12. An integrated circuit comprising:
a mixer configured to down-convert a radio frequency (RF) signal; and
a transimpedance amplifier coupled to the mixer, the transimpedance amplifier comprising:
a first operational amplifier, wherein a first input terminal of the first operational amplifier is coupled to an output terminal of the mixer;
a first resistor coupled between the first input terminal of the first operational amplifier and a first output terminal of the first operational amplifier;
a second operational amplifier;
a second resistor coupled between the first output terminal of the first operational amplifier and a first input terminal of the second operational amplifier; and
a first reconfigurable filter coupled between the first input terminal of the second operational amplifier and a first output terminal of the second operational amplifier, wherein the first reconfigurable filter is configured to, under control of a first control signal, switch between a first-order high-pass filter and a second-order high-pass filter.

13. The integrated circuit of claim 12, wherein the first reconfigurable filter comprises:
a first switch and a first capacitor that are coupled in series between an input terminal of the first reconfigurable filter and a node;
a second switch coupled between the input terminal of the first reconfigurable filter and the node;
a second capacitor coupled between the node and an output terminal of the first reconfigurable filter; and
a third resistor coupled between the node and a reference voltage node.

14. The integrated circuit of claim 13, wherein the first operational amplifier and the second operational amplifier are differential operational amplifiers, wherein the transimpedance amplifier further comprises:

a fourth resistor coupled between a second input terminal of the first operational amplifier and a second output terminal of the first operational amplifier;

a fifth resistor coupled between the second output terminal of the first operational amplifier and a second input terminal of the second operational amplifier; and a second reconfigurable filter coupled between the second input terminal of the second operational amplifier and a second output terminal of the second operational amplifier, wherein the second reconfigurable filter has a same structure as the first reconfigurable filter, and is configured to, under control of a second control signal, switch between a first-order high-pass filter and a second-order high-pass filter.

15. The integrated circuit of claim 14, wherein the transimpedance amplifier further comprises:

a sixth resistor coupled between the first input terminal of the first operational amplifier and the second output terminal of the second operational amplifier; and a seventh resistor coupled between the second input terminal of the first operational amplifier and the first output terminal of the second operational amplifier.

16. The integrated circuit of claim 13, wherein the transimpedance amplifier further comprises:

a third operational amplifier;

a fourth resistor coupled between the first output terminal of the second operational amplifier and a first input terminal of the third operational amplifier;

a fifth resistor coupled between the first input terminal of the third operational amplifier and a first output terminal of the third operational amplifier; and a sixth resistor coupled between the first input terminal of the first operational amplifier and the first output terminal of the third operational amplifier.

17. The integrated circuit of claim 12, further comprising an analog-to-digital converter coupled to an output terminal of the transimpedance amplifier.

18. A transimpedance amplifier comprising:

a first operational amplifier;

a second operational amplifier;

a first resistor coupled between a first input terminal of the first operational amplifier and a first output terminal of the first operational amplifier;

a second resistor coupled between the first output terminal of the first operational amplifier and a first input terminal of the second operational amplifier; and a capacitor-resistor-capacitor (CRC) network coupled between the first input terminal of the second operational amplifier and a first output terminal of the second operational amplifier, comprising:

a first capacitor coupled between an input terminal of the CRC network and a node;

a second capacitor coupled between the node and an output terminal of the CRC network; and a third resistor coupled between the node and a reference voltage node.

19. The transimpedance amplifier of claim 18, wherein the CRC network further comprises:

a first switch coupled in series with the first capacitor between the input terminal of the CRC network and the node; and a second switch coupled between the input terminal of the CRC network and the node.

20. The transimpedance amplifier of claim 18, further comprising:

a third operational amplifier;

a fourth resistor coupled between the first output terminal of the second operational amplifier and a first input terminal of the third operational amplifier;

a fifth resistor coupled between the first input terminal of the third operational amplifier and a first output terminal of the third operational amplifier; and a sixth resistor coupled between the first input terminal of the first operational amplifier and the first output terminal of the third operational amplifier.

* * * * *